(12) United States Patent
Lee et al.

(10) Patent No.: US 7,030,409 B2
(45) Date of Patent: Apr. 18, 2006

(54) ORGANIC SEMICONDUCTOR POLYMER FOR ORGANIC THIN FILM TRANSISTOR CONTAINING QUINOXALINE RING IN THE BACKBONE CHAIN

(75) Inventors: Bang Lin Lee, Gyeonggi-Do (KR); Eun Jeong Jeong, Gyeonggi-Do (KR); Kook Min Han, Gyeonggi-Do (KR); In Nam Kang, Gyeonggi-Do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 125 days.

(21) Appl. No.: 10/844,380

(22) Filed: May 13, 2004

(65) Prior Publication Data

US 2005/0121668 A1 Jun. 9, 2005

(30) Foreign Application Priority Data

Dec. 8, 2003 (KR) .................... 10-2003-0088655

(51) Int. Cl.
*H01L 21/00* (2006.01)
(52) U.S. Cl. ..................... 257/40; 257/289; 438/99
(58) Field of Classification Search .................. None
See application file for complete search history.

(56) References Cited

U.S. PATENT DOCUMENTS

| 5,347,144 | A | * | 9/1994 | Garnier et al. ............... 257/40 |
| 5,625,199 | A | | 4/1997 | Baumbach et al. |
| 6,107,117 | A | | 8/2000 | Bao et al. |
| 6,452,207 | B1 | | 9/2002 | Bao |
| 6,621,099 | B1 | * | 9/2003 | Ong et al. .................... 257/40 |
| 6,828,044 | B1 | * | 12/2004 | Conley ....................... 428/690 |
| 6,855,951 | B1 | * | 2/2005 | Ong et al. .................... 257/40 |
| 6,949,762 | B1 | * | 9/2005 | Ong et al. .................... 257/40 |

FOREIGN PATENT DOCUMENTS

WO 00/79617 A1 12/2000

OTHER PUBLICATIONS

H. Sirringhaus, et al., "High-Resolution Inkjet Printing of All-Polymer Transistor Circuits", Science, vol. 290, Dec. 15, 2000, pp. 2123-2126.
T. Yamamoto, et al., "π-Conjugated Donor-Acceptor Copolymers Constituted of π-Excessive and π-Deficient Arylene Units. Optical and Electrochemical Properties in Relation to CT Structure of the Polymer", J. Am. Chem. Soc. 1996, 118, pp. 10389-10399.

* cited by examiner

*Primary Examiner*—Luan Thai
(74) *Attorney, Agent, or Firm*—Buchanan Ingersoll PC (57) ABSTRACT

Disclosed herein is a composite-structured organic semiconductor polymer for an organic thin film transistor which contains quinoxaline rings in the backbone of the polymer. According to the organic semiconductor polymer, since quinoxaline rings having n-type semiconductor characteristics, such as high electron affinity, are incorporated into a polythiophene having p-type semiconductor characteristics, the organic semiconductor polymer simultaneously exhibits both p-type and n-type semiconductor characteristics. In addition, the polythienylquinoxaline derivative exhibits high solubility in organic solvents, co-planarity and stability in air. Furthermore, when the polythienylquinoxaline derivative is used as an active layer of an organic thin film transistor, the organic thin film transistor exhibits a high charge carrier mobility and a low off-state leakage current.

11 Claims, 3 Drawing Sheets

ORGANIC SEMICONDUCTOR POLYMER FOR ORGANIC THIN FILM TRANSISTOR CONTAINING QUINOXALINE RING IN THE BACKBONE CHAIN

This non-provisional application claims priority under 35 U.S.C. § 119(a) to Korean Patent Application No.2003-88655 filed on Dec. 8, 2003, which is herein incorporated by reference.

BACKGROUND OF THE INVENTION

1. Field of the Invention

The present invention relates to an organic semiconductor polymer for an organic thin film transistor which contains quinoxaline rings in the backbone of the polymer. More particularly it relates to an organic semiconductor polymer for an organic thin film transistor in which quinoxaline rings having n-type semiconductor characteristics (e.g., high electron affinity) are incorporated into a polythiophene having p-type semiconductor characteristics, thereby simultaneously exhibiting both p-type and n-type semiconductor characteristics.

2. Description of the Related Art

Organic semiconductor materials for organic thin film transistors are largely divided into low molecular weight materials, e.g., pentacene, and high molecular weight materials, e.g., polythiophene. Although high molecular weight materials have poor device characteristics such as low charge carrier mobility, compared to low molecular weight materials, there is an advantage in terms of their easy processability: They can be processed in a large area at low costs by solution processing such as a printing technique. Since high molecular weight organic semiconductor materials can be formed into solutions, unlike the low molecular weight materials, they can be formed into thin films by screen-printing, ink-jet and roll-printing techniques. Such advantages of the high molecular weight organic semiconductor materials enable fabrication of large area transistors on plastic films at low cost.

Cambridge University and Seiko Epson Corp. have already fabricated and tested high molecular weight-based organic thin film transistor devices employing a polythiophene-based material, i.e. F8T2 (WO 00/79617 A1, Science, 2000, vol. 290, pp. 2132~2126, charge carrier mobility: 0.01~0.02 cm$^2$/Vs). Bao. Z et al. from Lucent Technologies Inc. disclosed the fabrication of organic thin film transistor devices employing P3HT, which is a regioregular polymer (U.S. Pat. No. 6,107,117, charge carrier mobility: 0.01~0.04 cm$^2$/Vs). As noted above, these organic thin film transistors using high molecular weight materials have a low charge carrier mobility, compared to organic thin film transistors using pentacene, but do not require a high operating frequency and can be fabricated at low costs.

For commercialization of organic thin film transistors, important parameters of high $I_{on}/I_{off}$ ratio, as well as high charge carrier mobility, should be met. To meet these parameters, off-state leakage current is required to be reduced to the lowest possible extent. A representative regioregular polythiophene-based polymer, P3HT shows a charge carrier mobility of about 0.01 cm$^2$/Vs, but has a low $I_{on}/I_{off}$ ratio of 400 or less due to its high off-state leakage current ($10^{-9}$A or more) (U.S. Pat. Nos. 6,452,207 and 6,107,117). Recently, attempts have been made to improve these properties in various ways.

Research teams from Lucent Technologies Inc. reported an improvement in the physical properties of organic thin film transistor devices by using a combination of an n-type inorganic semiconductor material and a p-type organic semiconductor material as an active layer (U.S. Pat. No. 5,625, 199). However, according to this patent, there is no particular difference from conventional silicon-based thin film transistor processes requiring deposition, which is not suitable for mass-production of thin film transistor devices.

T. Yamamoto et al. proposed an organic semiconductor polymer in which heteroaromatic rings having different electrical properties, such as quinoxaline rings are introduced into the backbone of the polymer, thereby simultaneously exhibiting both p-type and n-type semiconductor characteristics (J. Am. Chem. Soc. 1996, 118, 10389). Until now, no application of the polymer as an active layer of an organic thin film transistor has been reported because of low solubility in organic solvents and bad film formability.

Until now, high molecular weight-based organic thin film transistors that simultaneously satisfy the requirements of high charge carrier mobility and low off-state leakage current have not been reported.

SUMMARY OF THE INVENTION

The present invention has been made in view of the above problems, and it is a feature of the present invention to provide a composite-structured polymer semiconductor material having a high charge carrier mobility and a low off-state leakage current in which an appropriately long thiophene derivative is introduced into the backbone of a conventional quinoxaline ring-incorporated organic semiconductor polymer exhibiting p-type and n-type semiconductor characteristics.

It is another feature of the present invention to provide a method of preparing the composite-structured polymer material.

It is still another feature of the present invention to provide an organic thin film transistor fabricated by using the composite-structured polymer material as an organic active layer.

In accordance with a feature of the present invention, there is provided a polythienylquinoxaline derivative represented by Formula 1 below:

(1)

wherein $R^1$ and $R^4$ are each independently a hydrogen atom, a hydroxyl group, a $C_{1-16}$ linear, branched or cyclic alkyl group, or a $C_{1-12}$ linear, branched or cyclic alkoxy group; $R^2$ and $R^3$ are each independently a hydrogen atom, a hydroxyl group, a $C_{1-16}$ linear, branched or cyclic alkyl group, a $C_{1-12}$ linear, branched or cyclic alkoxy group, or a $C_{6-18}$ aryl group of an aromatic ring or a heteroaromatic ring, where the aryl group may be substituted with at least one substituent selected from the group consisting of a hydroxyl group, $C_{1-16}$ linear, branched and cyclic alkyl groups, and $C_{1-12}$ linear, branched and cyclic alkoxy groups; A is NH, O or S;

n is 1 or 2; and both a and b are each independently real numbers satisfying the conditions $0.01 \leq a/(a+b) \leq 0.99$ and $0.01 \leq b/(a+b) \leq 0.99$.

In accordance with another feature of the present invention, there is provided a method for preparing a polythienylquinoxaline derivative by polymerizing a monomer represented by Formula 2 below:

wherein $R^1$, A and n are as defined in Formula 1 above, and R is a $C_{1-6}$ alkyl group;

a monomer represented by Formula 3 below:

wherein $R^2$ and $R^3$ are as defined in Formula 1 above, and X is a halogen atom; and a monomer represented by Formula 4 below:

wherein $R^4$ is as defined in Formula 1 above, R is a $C_{1-6}$ alkyl group, and X is a halogen atom, under nitrogen atmosphere at 60~120° C. for 48~72 hours in the presence of a catalyst represented by Formula 6a or 6b below:

wherein L is at least one ligand selected from the group consisting of triphenylphosphine ($PPh_3$), triphenylphosphite $P(OPh)_3$, tri(2-furyl)phosphine(($2$-furyl)$_3$P) and triphenylarsine ($AsPh_3$); or wherein L is as defined in Formula 6a above, and X is a halogen atom.

In accordance with still another feature of the present invention, there is provided an organic thin film transistor comprising a substrate, a gate electrode, a gate insulating film, an organic active layer and source-drain electrodes wherein the organic active layer comprises the polythienylquinoxaline derivative of Formula 1.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, the present invention will be explained in more detail.

The polythienylquinoxaline derivative of the present invention has a structure in which quinoxaline rings are incorporated into the backbone of a polythiophene derivative, represented by Formula 1 below:

wherein $R^1$ and $R^4$ are each independently a hydrogen atom, a hydroxyl group, a $C_{1-16}$ linear, branched or cyclic alkyl group, or a $C_{1-12}$ linear, branched or cyclic alkoxy group; $R^2$ and $R^3$ are each independently a hydrogen atom, a hydroxyl group, a $C_{1-16}$ linear, branched or cyclic alkyl group, a $C_{1-12}$ linear, branched or cyclic alkoxy group, or a $C_{6-18}$ aryl group of an aromatic ring or a heteroaromatic ring, the aryl group may be substituted with at least one substituent selected from the group consisting of a hydroxyl group, $C_{1-16}$ linear, branched and cyclic alkyl groups, and $C_{1-12}$ linear, branched and cyclic alkoxy groups; A is NH, O or S; n is 1 or 2; and both a and b are each independently real numbers satisfying the conditions $0.01 \leq a/(a+b) \leq 0.99$ and $0.01 \leq b/(a+b) \leq 0.99$.

The polythienylquinoxaline derivative of the present invention exhibits high solubility in organic solvents, co-planarity and stability in air. When the polythienylquinoxaline derivative of the present invention is used as an active layer of an organic thin film transistor, the organic thin film transistor exhibits a high charge carrier mobility and a low off-state leakage current.

The polythienylquinoxaline derivative of the present invention is prepared by the polymerization of a monomer represented by Formula 2 below:

(2)

wherein $R^1$, A and n are as defined in Formula 1 above, and R is a $C_{1-6}$ alkyl group; a monomer represented by Formula 3 below:

(3)

wherein $R^2$ and $R^3$ are as defined in Formula 1 above, and X is a halogen atom; and a monomer represented by Formula 4 below:

(4)

wherein $R^4$ is as defined in Formula 1 above, R is a $C_{1-6}$ alkyl group, and X is a halogen atom.

The quinoxaline derivative of Formula 3 is synthesized through the formation of an aromatic ring by a dehydration reaction using o-phenylenediamine and a 1,2-diketone derivative as starting materials, as depicted by Reaction Scheme 1 below:

Reaction Scheme 1

As representative examples of the quinoxaline derivative, there is provided compounds represented by Formulae 5a to 5c below:

(5a)

wherein $R^5$ and $R^6$ are each independently a hydrogen atom, a hydroxyl group, a $C_{1-16}$ linear, branched or cyclic alkyl group, or a $C_{1-12}$ linear, branched or cyclic alkyl group, and X is a halogen atom;

(5b)

wherein $R^5$, $R^6$ and X are as defined in Formula 5a above; and (5c)

wherein $R^5$, $R^6$ and X are as defined in Formula 5a above.

To prepare the polythienylquinoxaline derivative of the present invention, representative polymerization processes of heteroaromatic compounds, including chemical or electrochemical oxidative polymerization and polycondensation polymerization in the presence of an organic transition metal such as nickel or palladium, can be used.

It is more preferred to carry out polycondensation polymerization in the presence of a palladium (0) compound of Formula 6a or a palladium (II) compound of Formula 6b below:

$$PdL_4 \quad (6a)$$

wherein L is at least one ligand selected from the group consisting of triphenylphosphine ($PPh_3$), triphenylphosphite $P(OPh)_3$, tri(2-furyl)phosphine(($2$-furyl$)_3$P) and triphenylarsine ($AsPh_3$);

$$PdL_2X_2 \quad (6b)$$

wherein L is as defined in Formula 6a above, and X is a halogen atom.

At this time, the polycondensation polymerization is carried out according to Reaction Scheme 2 depicted below:

Reaction Scheme 2

In the synthesis of the polythienylquinoxaline derivative, the thiophene monomer of Formula 2 is used in the same molar amount as the quinoxaline monomer of Formula 3. The molar ratio of the polythiophene monomer of Formula 4 to the polythiophene monomer or the quinoxaline monomer is in the range between 0.01:0.99 and 0.99:0.01.

As the palladium (0) compound, tetrakis-(triphenylphosphine)palladium (0) (Pd(PPh$_3$)$_4$) is preferably used. The palladium (0) compound is used in an amount of 0.2~10 mole %, relative to the monomers. Specifically, the polymerization reaction is carried out under nitrogen atmosphere at 60~120° C. for 48~72 hours. At this time, toluene, dimethylformamide (DMF), tetrahydrofuran (THF), N-methyl-2-pyrrolidinone (NMP) or the like can be used as a polymerization solvent. The polythienylquinoxaline derivative thus prepared has a number average molecular weight ranging from 40,000 to 80,000.

The polythienylquinoxaline derivative of the present invention can be used as a novel organic semiconductor material constituting an active layer of an organic thin film transistor device. At this time, the active layer can be formed into a thin film by screen printing, printing, spin-coating, dipping and ink jet printing.

General organic thin film transistor devices have structures including a substrate/a gate electrode/a gate insulating layer/an active layer/source-drain electrodes, and a substrate/a gate electrode/a gate insulating layer/source-drain electrodes/an active layer, but are not limited to these structures.

The gate insulating layer of the OTFT devices can be made of common insulators having a high dielectric constant. Specific examples of insulators include, but are not limited to, ferroelectric insulators, such as Ba$_{0.33}$Sr$_{0.66}$TiO$_3$ (BST: barium strontium titanate), Al$_2$O$_3$, Ta$_2$O$_5$, La$_2$O$_5$, Y$_2$O$_3$, TiO$_2$, etc.; inorganic insulators, such as PbZr$_{0.33}$Ti$_{0.66}$O$_3$ (PZT), Bi$_4$Ti$_3$O$_{12}$, BaMgF$_4$, SrBi$_2$(TaNb)$_2$O$_9$, Ba(ZrTi)O$_3$ (BZT), BaTiO$_3$, SrTiO$_3$, Bi$_4$Ti$_3$O$_{12}$, SiO$_2$, SiN$_x$, AlON, etc.; and organic insulators, such as polyimide, BCB (benzocyclobutene), parylene, polyacrylate, polyvinylalcohol, polyvinylphenol, etc.

The gate, source and drain electrodes of the organic thin film transistor of the present invention can be made of metals commonly used as electrodes. Specific examples of metals include, but are not limited to, gold (Au), silver (Ag), aluminum (Al), nickel (Ni), indium tin oxide (ITO) and the like.

The substrate of the organic thin film transistor of the present invention can be made of, but is not limited to, glass, polyethylenenaphthalate (PEN), polyethylene-terephthalate (PET), polycarbonate, polyvinylalcohol, poly-acrylate, polyimide, polynorbornene, polyethersulfone (PES) and the like.

Hereinafter, the present invention will be explained in more detail with reference to the following examples. However, these examples are given for the purpose of illustration and not of limitation

PREPARATIVE EXAMPLE 1

Synthesis of 2,5-bis(trimethylstannyl)thiophene

After 18.4 mL (30 mmol) of n-butyl lithium solution (n-BuLi, 1.63M in hexane) was added to a solution of 3.0 g (12.4 mmol) dibromothiophene in tetrahydrofuran (50 mL) at −50° C. under nitrogen atmosphere, the reaction was allowed to proceed for 30 minutes. To the mixture was added 5 g of trimethylstannyl chloride (SnMe$_3$Cl, 25 mmol) and the reaction was continued at −50° C. for about 4~5 hours. Next, the aqueous layer and organic layer were separated. The obtained organic layer was dried over a drying agent, and then solvents were removed. The resulting crude product was recrystallized from ether twice to afford 3.1 g (yield: 60%) of the title compound as a white crystal.

$^1$H-NMR (300 MHz, CDCl$_3$) δ (ppm) 0.38 (CH$_3$, 18H), 7.38 (2H, Thiophene-H).

PREPARATIVE EXAMPLE 2

Synthesis of 2,5-bis(trimethylstannyl)bithiophene

The title compound was prepared in a yield of 68% in the same manner as in Preparative Example 1, except that dibromobithiophene was used instead of dibromothiophene.

$^1$H-NMR (300 MHz, CDCl$_3$) δ (ppm) 0.38 (CH$_3$, 18H), 7.08 (d, 2H, Thiophene-H), 7.27 (d, 2H, Thiophene-H).

PREPARATIVE EXAMPLE 3

Synthesis of 5,8-dibromoquinoxaline Derivative (1) Synthesis of 5,8-dibromoquinoxaline Derivative (a)

To a solution of 4.0 g (15.0 mmol) of 3,6-dibromo-o-phenylenediamine and 4.88 g (18.0 mmol) of 4,4'-dimethoxybenzil in 60 mL of butanol, 2~3 drops of glacial acetic acid were added. The resulting solution was stirred at 120° C. for 5 hours. After completion of the reaction, the reaction solution was cooled to 0° C. and filtered. The filtrate was washed twice with hot ethanol, and dried to afford the title compound (yield: 64% (9.6 mmol).

$^1$H-NMR (300 MHz, CDCl$_3$) δ (ppm) 3.85 (s, 6H, Phenyl-O—CH$_3$), 6.89 (d, 4H, Phenyl-H), 7.66 (d, 4H, Phenyl-H), 7.85 (d, 2H, Quinoxaline-H).

(2) Synthesis of 5,8-dibromoquinoxaline Derivative (b)

4.55 g (9.1 mmol) of 5,8-dibromoquinoxaline derivative (a) prepared above and pyridine hydrochloride (Py-HCl, 40 g) in an equivalence ratio of 1:30 were charged into a round-flask. After the resulting mixture was stirred at 200° C. for 8 hours, it was allowed to cool to room temperature. To the cold mixture was added 80 mL of 2.5% hydrochloric acid aqueous solution. The resulting mixture was vigorously stirred, and then ether was added thereto. After the obtained organic layer was sequentially treated with dilute hydrochloric acid aqueous solution, sodium hydroxide aqueous solution and again hydrochloric acid aqueous solution, ether was added thereto. The obtained organic layer was washed with water and dried over a drying agent to afford the title compound (yield: 96% (8.7 mmol)) as a yellow powder. The compound was used for subsequent reaction.

(3) Synthesis of 5,8-dibromoquinoxaline Derivative (c)

Figure 1:
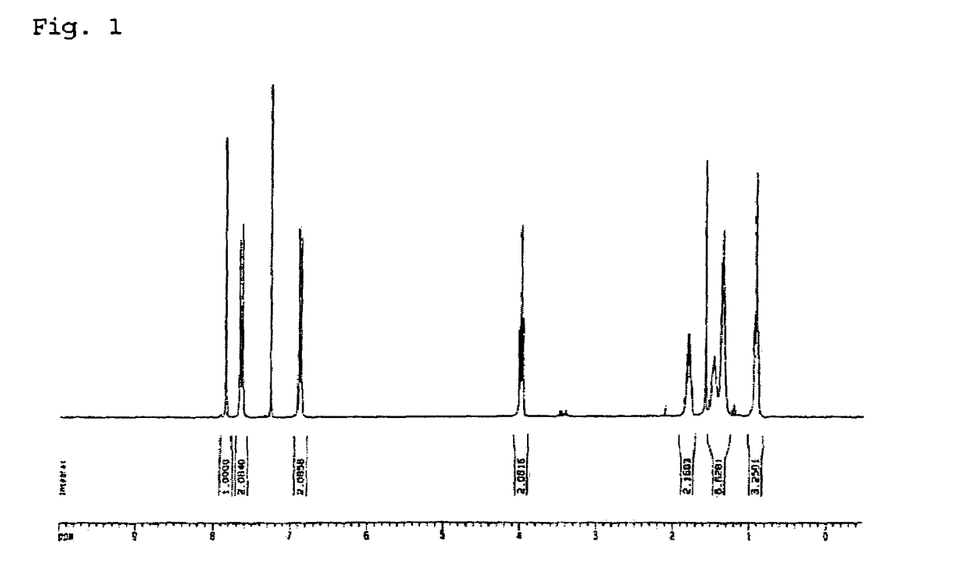
FIG. 1 is a $^1$H-NMR spectrum of a quinoxaline derivative synthesized in Preparative Example 3(c) of the present invention.

6.0 g (12.7 mmol) of the 5,8-dibromoquinoxaline derivative (b) prepared above and a potassium hydroxide (KOH) aqueous solution (0.5M, 32 mmol) were dissolved in ethanol. After the solution was stirred at room temperature for 1 hour, 5.25 g (32 mmol) of n-bromohexane was added thereto. The resulting mixture was reacted at 70° C. for 24 hours. Thereafter, the reaction mixture was cooled to −20° C., filtered, and purified by column chromatography (eluent: chloroform, packing material: silica gel ($SiO_2$)) to afford the title compound (yield: 51% (2.2 mmol)) as a yellow solid. The $^1$H-NMR spectrum ($CDCl_3$) of the monomer (c) is shown in FIG. 1.

$^1$H-NMR (300 MHz, $CDCl_3$) δ (ppm) 0.92 (6H, $CH_3$), 1.32~1.50 (m, 2nH, —$(CH_2)_n$—), 1.80 (m, 4H, —$CH_2$—), 3.99 (t, 4H, Phenyl-O—$CH_2$—), 6.87 (d, 4H, Phenyl-H), 7.64 (d, 4H, Phenyl-H), 7.85 (d, 2H, Quinoxaline-H).

PREPARATIVE EXAMPLE 4

Synthesis of 2-bromo-3-hexyl-5-trimethylstannyl thiophene (e)

3-hexylthiophene and N-bromosuccinimide (hereinafter, referred to as 'NBS') in the same amount were reacted in DMF at room temperature for 15 hours to obtain 2-bromo-3-hexylthiophene (d). 12.4 g (50 mmol) of the 2-bromo-3-hexylthiophene (d) was added to a solution of 28 mL (56 mmol) of lithium diisopropylamine (hereinafter, referred to as 'LDA', 2.0M in THF/Hexane) in 40 mL of anhydrous THF at about −80~−90° C. with stirring. At this temperature, the reaction was allowed to proceed for 20~30 minutes. A solution of 10.0 g (50 mmol) of $Me_3SnCl$ in THF was added to the mixture, and was then stirred at −50° C. for 1 hour.

Figure 2:
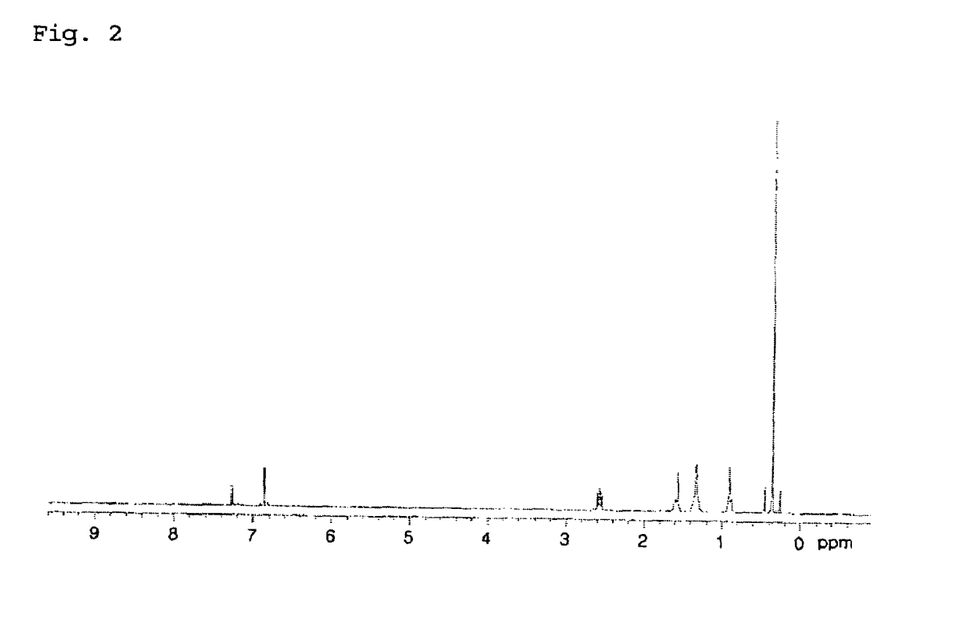
FIG. 2 is a $^1$H-NMR spectrum of a thiophene derivative synthesized in Preparative Example 4 of the present invention.

After completion of the reaction, the reaction mixture was extracted with ether and water. The obtained organic layer was concentrated, and distilled to afford the title compound (yield: 78%) as a colorless oil. The $^1$H-NMR spectrum ($CDCl_3$) of the monomer (3) is shown in FIG. 2.

$^1$H-NMR (300 MHz, $CDCl_3$) δ (ppm) 0.34 (9H, $CH_3$), 0.88 (3H, $CH_3$), 1.31 (broad, 2nH, —$(CH_2)_n$—), 1.56 (m, 2H, —$CH_2$—), 2.55 (t, 2H, Thiophene-$CH_2$—), 6.84 (s, Thiophene-H).

PREPARATIVE EXAMPLE 5

Synthesis of polythienyl-quinoxaline (PTQx-T)

Figure 3:
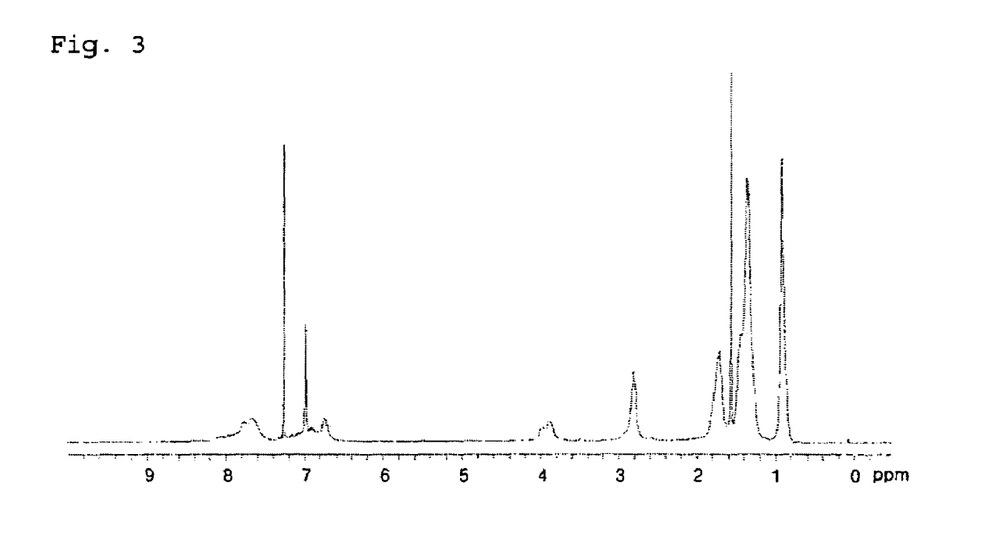
FIG. 3 is a $^1$H-NMR spectrum of a polythienylquinoxaline derivative synthesized in Preparative Example 5 of the present invention.

0.5 g (1.22 mmol) of the thiophene monomer synthesized in Preparative Example 1 and 0.78 g (1.22 mmol) of the quinoxaline monomer synthesized in Preparative Example 3(3) were charged into a reactor under nitrogen atmosphere, and dissolved in anhydrous DMF with mild heating. To the solution were added 1.5 g (3.66 mmol) of 2-bromo-3-hexyl-5-trimethylstannyl thiophene synthesized in Preparative Example 4 and Pd(PPh$_3$)$_4$ as a polymerization catalyst in an amount of 7.0 mole % relative to the total monomers. The resulting mixture was reacted at 85° C. for 72 hours. After the reaction, the reactant mixture was allowed to cool to room temperature, and filtered to obtain a polymeric solid. The polymeric solid was sequentially washed with hydrochloric acid/chloroform twice, ammonia aqueous solution/chloroform twice, and water/chloroform once, and repreciptated in methanol. The precipitate was collected, and dried to afford 0.6 g of the title compound as a black solid. The $^1$H-NMR spectrum ($CDCl_3$) of the polymer 1 is shown in FIG. 3.

$^1$H-NMR (300 MHz, $CDCl_3$) δ (ppm) 0.92 ($CH_3$), 1.35~1.44 ($CH_2$), 1.72 ($CH_2$), 2.81 (Thiophene-$CH_2$), 3.76~4.00 (—O—$CH_2$), 6.74 (Phenyl-H), 6.98 (Thiophene-H), 7.61~7.80 (Thiophene-H and Phenyl-H), 8.04 (Qunioxaline-H).

COMPARATIVE PREPARATION EXAMPLE

Synthesis of polythienylquinoxaline (PTQx)

The title compound was prepared in the same manner as in Preparative Example 5, except that 2-bromo-3-hexyl-5-trimethylstannyl thiophene (Preparative Example 4) was not added.

EXAMPLE 1

Fabrication of Organic Thin Film Transistor Device

In this example, organic thin film transistors were fabricated by using the organic semiconductor materials in Preparative Example 5 and the Comparative Preparation Example, respectively. Each organic thin film transistor was prepared in accordance with the following procedure.

Figure 4:
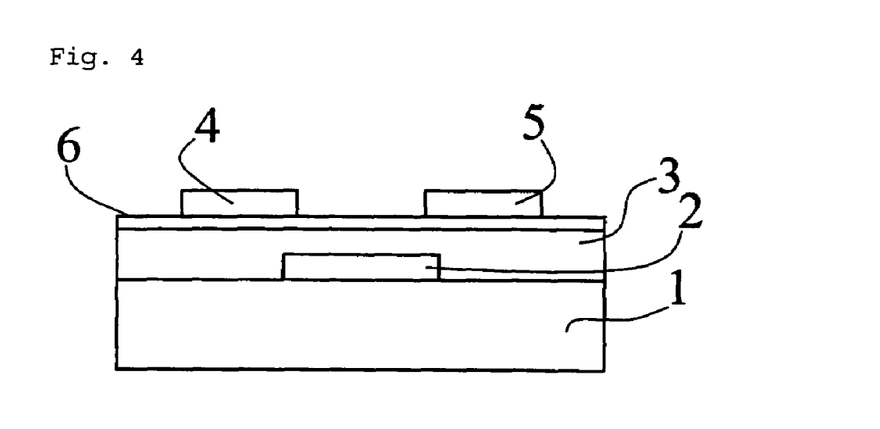
FIG. 4 is a cross-sectional view schematically showing the structure of a device fabricated in Example 1 of the present invention.

First, a silicon oxide film was deposited on a washed silicon substrate by CVD technique to a thickness of 3,000 Å. Al was deposited on the silicon oxide film by a vacuum deposition technique to form a gate electrode having a thickness of 2,000 Å. A solution of 10% by weight of a polyvinylphenol-based compound in NMP was spin-coated at 1,000rpm onto the gate electrode to a thickness of 7,000 Å, and baked under nitrogen atmosphere at 100° C. for 1 hour to form an organic gate insulating film. Next, a solution of 1% by weight of an organic semiconductor material in toluene was spin-coated to a thickness of 1,000 Å, and baked under nitrogen atmosphere at 100° C. for 1 hour to form an active layer. Au (gold), as a material for source-drain electrodes, was deposited on the organic active layer to a thickness of 1,000 Å through a shadow mask having a channel length of 100 μm and a channel width of 2 mm to fabricate a top-contact organic thin film transistor as shown in FIG. 4 (1: a substrate, 2: a gate electrode, 3: a gate insulating layer, 4: a source electrode, 5: a drain electrode, 6: an organic active layer).

Figure 5A:
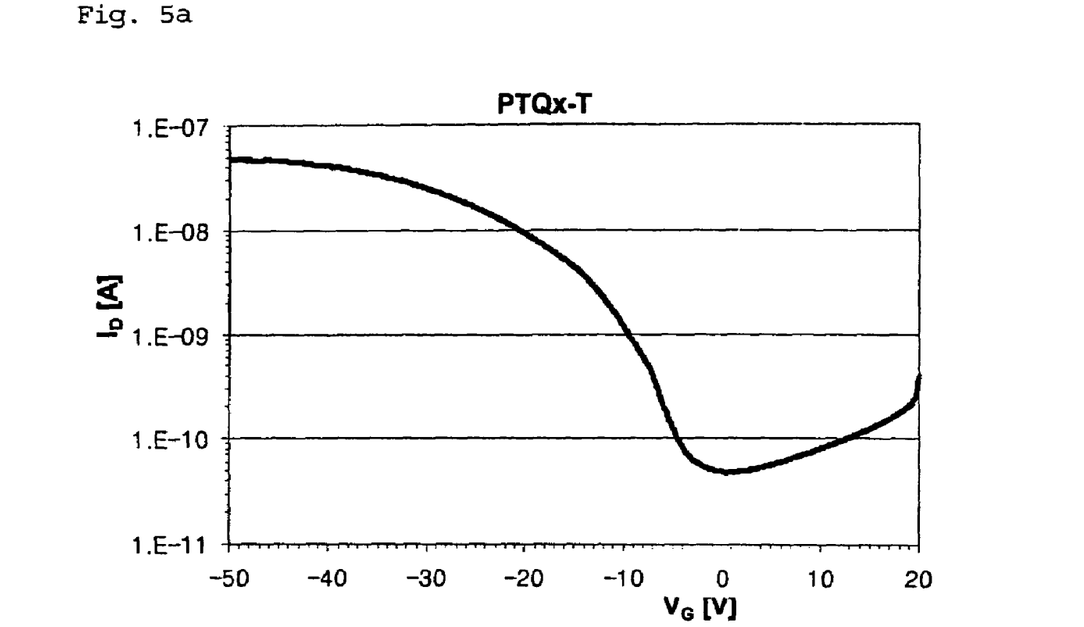
FIGS. 5a and 5b are curves showing the current transfer characteristics of devices fabricated in Example 1 of the present invention.
Figure 5B:
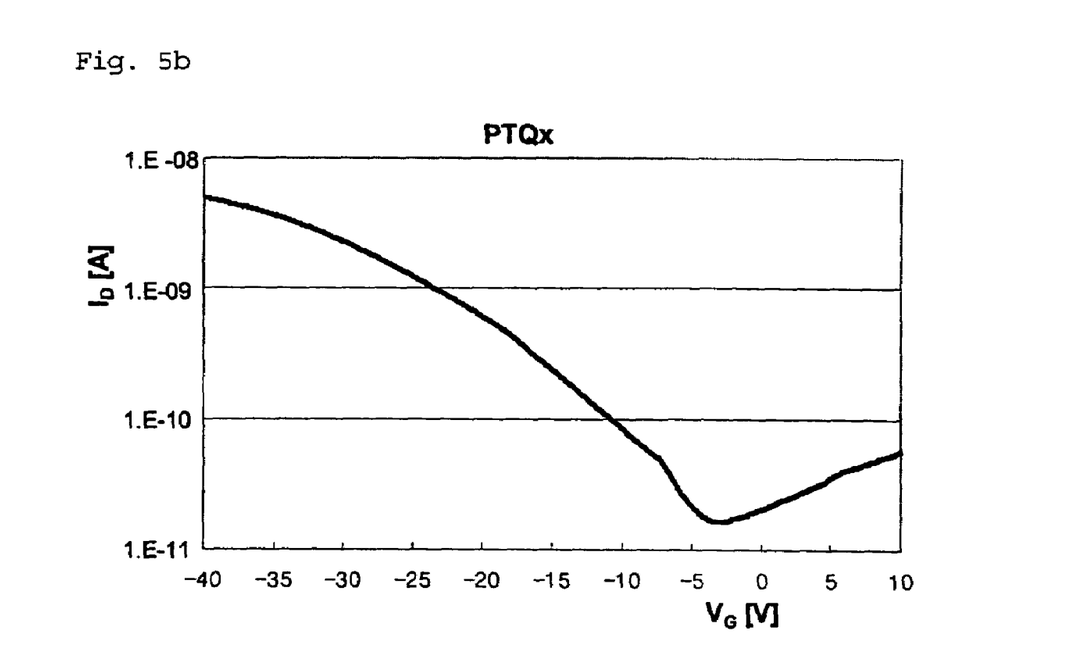

Curves showing the current transfer characteristics of the devices were plotted using a KEITHLEY semiconductor characterization system (4200-SCS) (FIGS. 5a and 5b). From the curves, the charge carrier mobility of the devices was calculated using the following current equation at the saturation region:

$$I_{SD} = \frac{WC_0}{2L}\mu(V_G - V_T)^2$$

The charge carrier mobility of the devices can be obtained from the slope of the $(ISD)^{1/2}$–$V_G$ graph in accordance with the following equations:

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

where $I_{SD}$: source-drain current; $\mu$ or $\mu_{FET}$: charge carrier mobility; $C_O$: capacitance of the insulating layer; W: channel width; L: channel length; $V_G$: gate voltage; and $V_T$: threshold voltage.

Off-state leakage current ($I_{off}$) is obtained by measuring a current flowing in the off-state.

$I_{on}/I_{off}$ ratio is obtained from the ratio of the maximum current value in the on-state to the minimum current value in the off-state.

TABLE 1

| Organic active layer | Charge carrier mobility (cm²/Vs) | $I_{on}/I_{off}$ ratio | Off-state leakage current (A) |
|---|---|---|---|
| Preparative Example 5 (PTQx-T) | 0.0012 | 1000 | 4.0 × 10⁻¹¹ |
| Comparative Preparation Example (PTQx) | 0.0004 | 500 | 1.2 × 10⁻¹¹ |

As can be seen from Table 1, since the polythienylquinoxaline derivative (PTQx) (Comparative Preparation Example) contains quinoxaline rings having a high electron affinity, the off-state leakage current of the organic thin film transistor was considerably reduced to 10⁻¹¹ A, but there was little improvement in charge carrier mobility and $I_{on}/I_{off}$ ratio. In contrast, the polythienylquinoxaline derivative (Preparative Example 5, PTQx-T) of the present invention showed increased mobility and the $I_{on}/I_{off}$ ratio by one order of magnitude as compared to the PTQz while the off-state leakage current was maintained.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A polythienylquinoxaline derivative represented by Formula 1 below:

(1)

wherein $R^1$ and $R^4$ are each independently a hydrogen atom, a hydroxyl group, a $C_{1-16}$ linear, branched or cyclic alkyl group, or a $C_{1-12}$ linear, branched or cyclic alkoxy group; $R^2$ and $R^3$ are each independently a hydrogen atom, a hydroxyl group, a $C_{1-16}$ linear, branched or cyclic alkyl group, a $C_{1-12}$ linear, branched or cyclic alkoxy group, or a $C_{6-18}$ aryl group of an aromatic ring or a heteroaromatic ring, wherein the aryl group may be substituted with at least one substituent selected from the group consisting of a hydroxyl group, $C_{1-16}$ linear, branched and cyclic alkyl groups, and $C_{1-12}$ linear, branched and cyclic alkoxy groups; A is NH, O or S; n is 1 or 2; and both a and b are each independently real numbers satisfying the conditions $0.01 \leq a/(a+b) \leq 0.99$ and $0.01 \leq b/(a+b) \leq 0.99$.

2. An organic thin film transistor comprising a substrate, a gate electrode, a gate insulating film, an organic active layer and source-drain electrodes wherein the organic active layer comprises the polythienylquinoxaline derivative according to claim 1.

3. The organic thin film transistor according to claim 2, wherein the organic active layer is formed into a thin film by a screen printing, printing, spin-coating, dipping or ink jet printing.

4. The organic thin film transistor according to claim 2, wherein the insulating layer is made of a material selected from ferroelectric insulators including $Ba_{0.33}Sr_{0.66}TiO_3$, $Al_2O_3$, $Ta_2O_5$, $La_2O_5$, $Y_2O_3$ and $TiO_2$; inorganic insulators including $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, $SiN_x$ and AlON; and organic insulators including polyimide, BCB(benzocyclobutene), parylene, polyacrylate, polyvinylalcohol and polyvinylphenol.

5. The organic thin film transistor according to claim 2, wherein the substrate is made of a material selected from the group consisting of glass, polyethylenenaphthalate (PEN), polyethyleneterephthalate (PET), polycarbonate, polyvinylalcohol, polyacrylate, polyimide, polynorbornene and polyethersulfone (PES).

6. The organic thin film transistor according to claim 2, wherein the gate, source and drain electrodes are made of a material selected from the group consisting of gold (Au), silver (Ag), aluminum (Al), nickel (Ni) and indium tin oxide.

7. A method for preparing a polythienylquinoxaline derivative by polymerizing a monomer represented by Formula 2 below:

(2)

wherein $R^1$ is a hydrogen atom, a hydroxyl group, a $C_{1-16}$ linear, branched or cyclic alkyl group, or a $C_{1-12}$ linear, branched or cyclic alkoxy group; A is NH, O or S; n is 1 or 2; and R is a $C_{1-6}$ alkyl group;

a monomer represented by Formula 3 below:

(3)

wherein $R^2$ and $R^3$ are each independently a hydrogen atom, a hydroxyl group, a $C_{1-16}$ linear, branched or cyclic alkyl group, a $C_{1-12}$ linear, branched or cyclic alkoxy group, or a $C_{6-18}$ aryl group of an aromatic ring or a heteroaromatic ring, wherein the aryl group may be substituted with at least one substituent selected from the group consisting of a hydroxyl group, $C_{1-16}$ linear, branched and cyclic alkyl groups, and $C_{1-12}$ linear, branched and cyclic alkoxy groups; and X is a halogen atom; and a monomer represented by Formula 4 below:

(4)

wherein $R^4$ is a hydrogen atom, a hydroxyl group, a $C_{1-16}$ linear, branched or cyclic alkyl group, or a $C_{1-12}$ linear, branched or cyclic alkoxy group; R is a $C_{1-6}$ alkyl group; and X is a halogen atom under nitrogen atmosphere at 60~120° C. for 48~72 hours in the presence of a catalyst represented by Formula 6a or 6b below:

PdL$_4$ (6a)

wherein L is at least one ligand selected from the group consisting of triphenylphosphine (PPh$_3$), triphenylphosphite P(OPh)$_3$, tri(2-furyl)phosphine((2-furyl)$_3$ P) and triphenylarsine (AsPh$_3$); or PdL$_2$X$_2$ (6b)

wherein L is as defined in Formula 6a above, and X is a halogen atom.

8. The method according to claim 7, wherein the monomer of Formula 2 is used in the same molar amount as the monomer of Formula 3, and the molar ratio of the monomer of Formula 4 to the monomer of Formula 2 or the monomer of Formula 3 is in the range between 0.01:0.99 and 0.99:0.01.

9. The method according to claim 7, wherein the monomer of Formula 3 is at least one selected from the group consisting of compounds represented by Formulae 5a to 5c below:

(5a)

wherein $R^5$ and $R^6$ are each independently a hydrogen atom, a hydroxyl group, a $C_{1-16}$ linear, branched and cyclic alkyl group, or a $C_{1-12}$ linear, branched and cyclic alkyl group, and X is a halogen atom;

(5b)

wherein $R_5$, $R^6$ and X are as defined in Formula 5a above; and (5c)

wherein $R_5$, $R^6$ and X are as defined in Formula 5a above.

10. The method according to claim 7, wherein the catalyst is tetrakis(triphenylphosphine)palladium (0).

11. The method according to claim 7, wherein the polythienylquinoxaline derivative has an average molecular weight ranging from 40,000 to 80,000.

* * * * *